US007855587B1

(12) United States Patent
Su

(10) Patent No.: US 7,855,587 B1
(45) Date of Patent: Dec. 21, 2010

(54) ASYMMETRIC SENSE-AMP FLIP-FLOP

(75) Inventor: Jason Su, Los Altos, CA (US)

(73) Assignee: Marvell International Ltd., Hamilton (BM)

( * ) Notice: Subject to any disclaimer, the term of this patent is extended or adjusted under 35 U.S.C. 154(b) by 383 days.

(21) Appl. No.: 11/755,564

(22) Filed: May 30, 2007

Related U.S. Application Data

(60) Provisional application No. 60/810,730, filed on Jun. 2, 2006.

(51) Int. Cl.
H03K 3/00 (2006.01)
(52) U.S. Cl. ...................... 327/218; 327/208
(58) Field of Classification Search ............ 327/218, 327/50–57, 202–203, 208; 326/94–98
See application file for complete search history.

(56) References Cited

U.S. PATENT DOCUMENTS

| 5,025,174 | A | | 6/1991 | Shikata |
| 5,867,049 | A | | 2/1999 | Mohd |
| 5,920,218 | A | | 7/1999 | Klass et al. |
| 6,107,853 | A | * | 8/2000 | Nikolic et al. ............... 327/217 |
| 6,278,308 | B1 | * | 8/2001 | Partovi et al. ............... 327/218 |
| 6,388,471 | B1 | | 5/2002 | Lu et al. |
| 6,404,253 | B1 | | 6/2002 | Hwang et al. |
| 6,417,711 | B2 | | 7/2002 | Fulkerson |
| 6,433,601 | B1 | | 8/2002 | Ganesan |
| 6,486,719 | B2 | * | 11/2002 | Kim ........................... 327/199 |
| 6,563,356 | B2 | | 5/2003 | Fulkerson |
| 7,218,160 | B2 | * | 5/2007 | Wada et al. ................. 327/200 |

OTHER PUBLICATIONS

Pham, D., et al., "the Design and Implementation of a First-Generation CELL Precessor." *Digest of Technical Papers.* 2005 IEEE International Solid-State Circuits Conference: pp. 184-185, (Feb. 2005).
Gronowski, Paul, et al. "High-Performance Microprocessor Design." *IEEE Journal of Solid-State Circuits*, vol. 33, No. 5; pp. 676-686, (May 1998).
Klass, Fabian, et al. "A New Family of Semidynamic and Dynamic Flip-Flops with Embedded Logic for High-Performance Processors." *IEEE Journal of Solid-State Circuits*, vol. 34, No. 5: pp. 712-716, (May 1999).

* cited by examiner

*Primary Examiner*—Lincoln Donovan
*Assistant Examiner*—Diana J Cheng

(57) ABSTRACT

An Asymmetric Sense-Amp Flip-Flop (ASAFF) is disclosed that may achieve zero setup time and short clock-to-Q delays. The ASAFF captures input data at a clock transition by setting values of a first node and a second node in a manner that is input data value dependent. If the input data is at the first input data value, the first node is set and held at a first storage value after a first delay, and the second node is set and held at a second storage value after a second delay, and if the input data is at a second input data value, the first node is set and held at a third storage value after a third delay, and the second node is set and held at a fourth storage value, after a fourth delay. This internal-path dependent difference in delay enables ASAFF to achieve zero setup time.

53 Claims, 11 Drawing Sheets

ASYMMETRIC SENSE-AMP FLIP-FLOP

INCORPORATION BY REFERENCE

This application claims the benefit of U.S. Provisional Application No. 60/810,730, "Asymmetric Sense-Amp Flip-Flops" filed by Jason T. Su on Jun. 2, 2006, which is incorporated in its entirety by reference herein.

BACKGROUND

In digital system applications, progressively more sophisticated architectures are required to meet the higher performance goals of every new generation of digital systems. As the operating frequencies of these systems increase, timing delays in components such as flip-flops need to be reduced. Delays introduced by flip-flops such as clock-to-Q time (the time between a data capture clock transition and a stable output), setup time (the amount of time a data signal must be stable prior a clock capturing transition), and hold time (the amount of time the data signal must be stable after the clock rising edge), etc. contribute to lower circuit operating frequencies.

SUMMARY

Disclosed herein is an Asymmetric Sense-Amp Flip-Flop (ASAFF) that may achieve zero setup time and short clock-to-Q times. Input data is captured by setting values of a first node and a second node which are pre-charged to favor a first input data value prior to a capturing clock transition. The ASAFF response to the clock transition is input data value dependent. If the input data is at the first input data value, at the clock transition, the first node is set and held at a first storage value after a first delay, and the second node is set and held at a second storage value, which is complementary of the first storage value, after a second delay; and if the input data is at a second input data value, at the clock transition, the first node is set and held at a third storage value after a third delay, and the second node is set and held at a fourth storage value, which is complementary of the third storage value, after a fourth delay. The second delay can be greater than the first delay, the fourth delay can be greater than the third delay, and the third delay can be greater than the first delay. This internal-path dependent difference in delay enables ASAFF to achieve zero setup time.

Values of the first and second nodes are input to an output latch so that the latch may follow the values of the first and second nodes as the values of the first and second nodes are changed by the input circuit. Thus, the clock-to-Q delay is not increased by addition of other possible delays that may be introduced by intervening circuits to set the latch based on the values of the first and second nodes.

ASAFF may be configured with an architecture that enables incorporation of combinatorial logic that performs logical functions on input data. Logical functions such as AND, OR, NOT, XOR, etc. and/or combinations of these may be performed and the logical result used to set the first and second nodes. Delays introduced by the combinatorial logic may be balanced by adding appropriate delay elements in the ASAFF to maintain the relationship between the first and second delays, and between the third and fourth delays, respectively, as mentioned above.

ASAFF can be a flip-flop that captures input data based on a clock transition, and that includes a master circuit for setting and holding a value of a first node based on a received input data, and a slave circuit for setting a value of a second node based on received input data. The flip-flop can further include a holding circuit that holds the first node at the value after a certain delay from the clock transition if the value is a first value, and holds the first node at the value after another delay from the clock transition if the value is a second value. The flip-flop can also include a keeper-up circuit that keeps the first node at the second value if the second node is set to a third value, and a keeper-down circuit that keeps the first node at the first value if the second node is set to a fourth value.

Alternatively, the flip-flop can include a first hold delay and a second hold delay that is less than the first hold delay, and a third hold delay and a fourth hold delay that is less than the third hold delay, wherein the flip-flop holds the first node at a first storage value after the first hold delay and the second node at a second storage value after the second hold delay from the clock transition if the received input data is a first value, and holds the first node at a third storage value after the third hold delay and the second node at a fourth storage value after the fourth hold delay from the clock transition if the received input data is a second value.

The keeper-up circuit can include a first transistor that has a control terminal connected to the second node, the first transistor being connected between the first node and a first supply terminal. The keeper-down circuit can include an inverter having an input terminal connected to the first node and an output terminal connected to a control terminal of a second transistor, the second transistor being connected between the first node and a third node formed by terminals of an input circuit that generated the received input data, and one of an evaluator circuit and a keeper-down control circuit.

The flip-flop can also include pre-charge circuits that pre-charge the first and second nodes, respectively; a second node control circuit that sets a value of the second node based on the value of the first node; an input circuit that receives the input data; a keeper-down control circuit; and an evaluator circuit, wherein the evaluator circuit, the input circuit and the keeper-down control circuit cooperate to set the value of the first node when triggered by the clock transition. The input circuit can include devices for performing logical functions that include one or more of a single one, a combination, or combinations of AND, OR, NOT, Multiplex, and XOR. Furthermore, the flip-flop can include a latch that generates outputs of the flip-flop based on values of the first and second nodes determined at a hold-time after the clock transition.

The flip-flop can also include one or more delay circuits that balance a delay generated by the input circuit by delaying the clock transition to the keeper-down control circuit and/or the second node control circuit.

BRIEF DESCRIPTION OF THE DRAWINGS

Embodiments of the ASAFF will be described with reference to the following drawings, wherein like numerals designate like elements, and wherein.

DETAILED DESCRIPTION OF EMBODIMENTS

Figure 1:
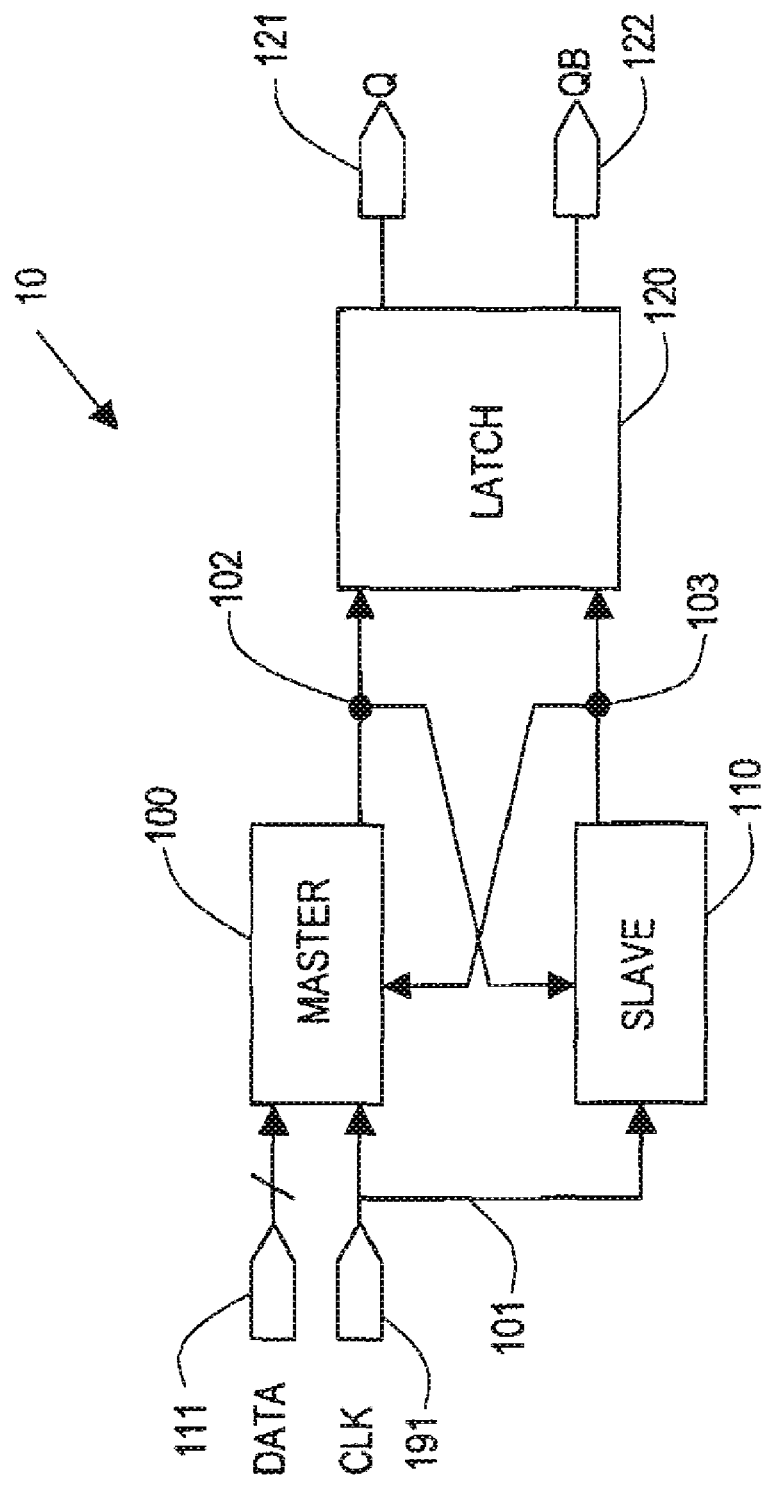
FIG. 1 shows an exemplary ASAFF high level block diagram.

FIG. 1 shows a high level block diagram of an exemplary ASAFF 10 that may include a master 100, a slave 110, and a latch 120 all coupled together at nodes 102 and 103. Master 100 and slave 110 are asymmetrically configured to make master 100 faster than slave 110. Data is received at a data input 111 that is coupled to master 100 and a clock is received at a clock input 191 that is coupled to master 100 and slave 110. Latch 120 includes outputs 121 and 122 which are outputs of ASAFF 10. While FIG. 1 shows a single data input 111, any number of data inputs may be provided for inputting multiple data signals, as discussed below. Also, in the following discussion, a "0" represents a "low" voltage and a "1" represents a "high" voltage. For a supply voltage of 5 volts, a low voltage may be less than 0.8 volts and a high voltage may be greater than 3.3 volts, for example.

Master 100 and slave 110 may be configured to reduce setup time to substantially 0. Assuming that ASAFF 10 is positive edge triggered, prior to a clock 0-to-1 transition at clock input 191 (rising edge), master 100 charges node 102 to a first value and slave 110 charges node 103 to a third value. If input 111 is a 0 at the clock rising edge, master 100 holds node 102 at the pre-charged first value and slave 110 discharges node 103 to a fourth value. However, if input 111 is a 1 at the clock rising edge, master 100 discharges node 102 to a second value and disables the hold function of slave 110 before slave 110 is able to discharge node 103 to the fourth value. Nodes 102 and 103 are charged or discharged based on the data value at or after the clock rising edge within a hold-time period. Thus, the setup time is substantially 0 for data input of either a 0 or a 1 value at the rising edge of clock input 191. Values at nodes 102 and 103 set latch circuit 120 so that outputs 121 and 122 are set to the value of captured data (Q) and its inverse (QB), respectively. Thus, the clock-to-Q delay is substantially a latch time of latch 120 and the time required to discharge node 102 or 103.

Figure 2:
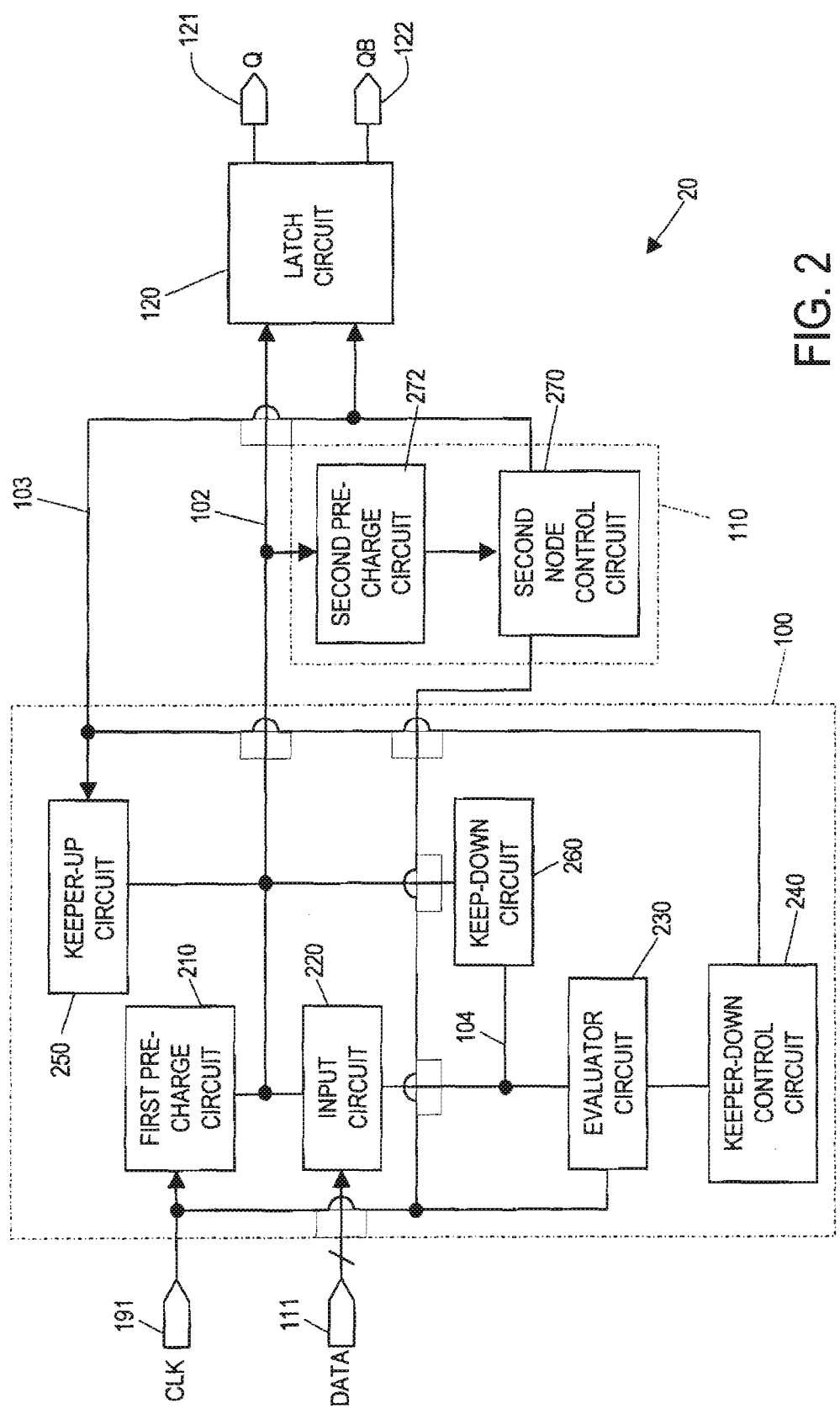
FIG. 2 shows an exemplary ASAFF circuit block diagram.

FIG. 2 shows a circuit block diagram of an exemplary ASAFF 20 that may include a first pre-charge circuit 210, an input circuit 220, an evaluator circuit 230, a keeper-down control circuit 240, a keeper-up circuit 250, a keeper-down circuit 260, a second node control circuit 270, a second pre-charge circuit 272 and latch circuit 120. Circuits 210-260 form master 100, and circuits 270 and 272 form slave 110.

Prior to the clock rising edge, clock input 191 is a 0, first pre-charge circuit 210 pre-charges node 102 to the first value, and second pre-charge circuit 272 pre-charges node 103 to the third value. The third value disables keeper-up circuit 250 and arms or prepares keeper-down control circuit 240. Node 102 at the first value arms second node control circuit 270. Keeper-up circuit 250 is controlled by the value of node 103 and enables master 100 to hold node 102 at the first value. Keeper-down circuit 260 is connected between nodes 102 and 104, and is connected to evaluator circuit 230 through node 104. Keeper-down circuit 260 can establish a path between nodes 102 and 104 when node 102 is discharged to the second value. Furthermore, keeper-down circuit 260 can establish and maintain a path to around for node 102 during evaluation, i.e., when clock input is a 1. Keeper-down control circuit 240 can prevent activation of keeper-down circuit 260 when input 111 is a 0 by disabling keeper-down circuit 260 through evaluator circuit 230.

A 0 at input 111 is evaluated between the rising edge of clock input 191 and when keeper-up circuit 250 is activated and when keeper-down control circuit 240 is disabled. A 1 at input 111 is evaluated between the rising edge of clock input 191 and when the keeper-down circuit 260 is enabled.

At a rising edge of clock input 191, input circuit 220 sets node 102 based on the value of input 111. If input 111 is a 0: 1) node 102 is left at the pre-charged first value, 2) second node control circuit 270 sets node 103 to a fourth value which activates keeper-up circuit 250 to hold node 102 at the first value, and 3) the fourth value at node 103 signals keeper-down control circuit 240 to disable evaluator circuit 230 and keeper-down circuit 260. If input 111 is a 1: 1) node 102 is set to the second value, 2) the second value at node 102 activates keeper-down circuit 260 to hold node 102 at the second value, and 3) second node control circuit 270 leaves node 103 at the pre-charged third value which, as noted above, disables the keeper-up circuit 250. Once keeper-down circuit 260 is activated, the evaluation of the data at input 111 ends. Thus, when input 111 is a 1, the data hold-time is between the clock rising edge and activation of keeper-down circuit 260. Note also, when input 111 is a 1, keeper-down control circuit 240 does not disable the evaluator circuit 230 and thus does not disable keeper-down circuit 260. As before, values at nodes 102 and 103 set latch 120 so that outputs 121 and 122 are set to the value of the captured data (Q) and its inverse (QB), respectively.

Figure 3:
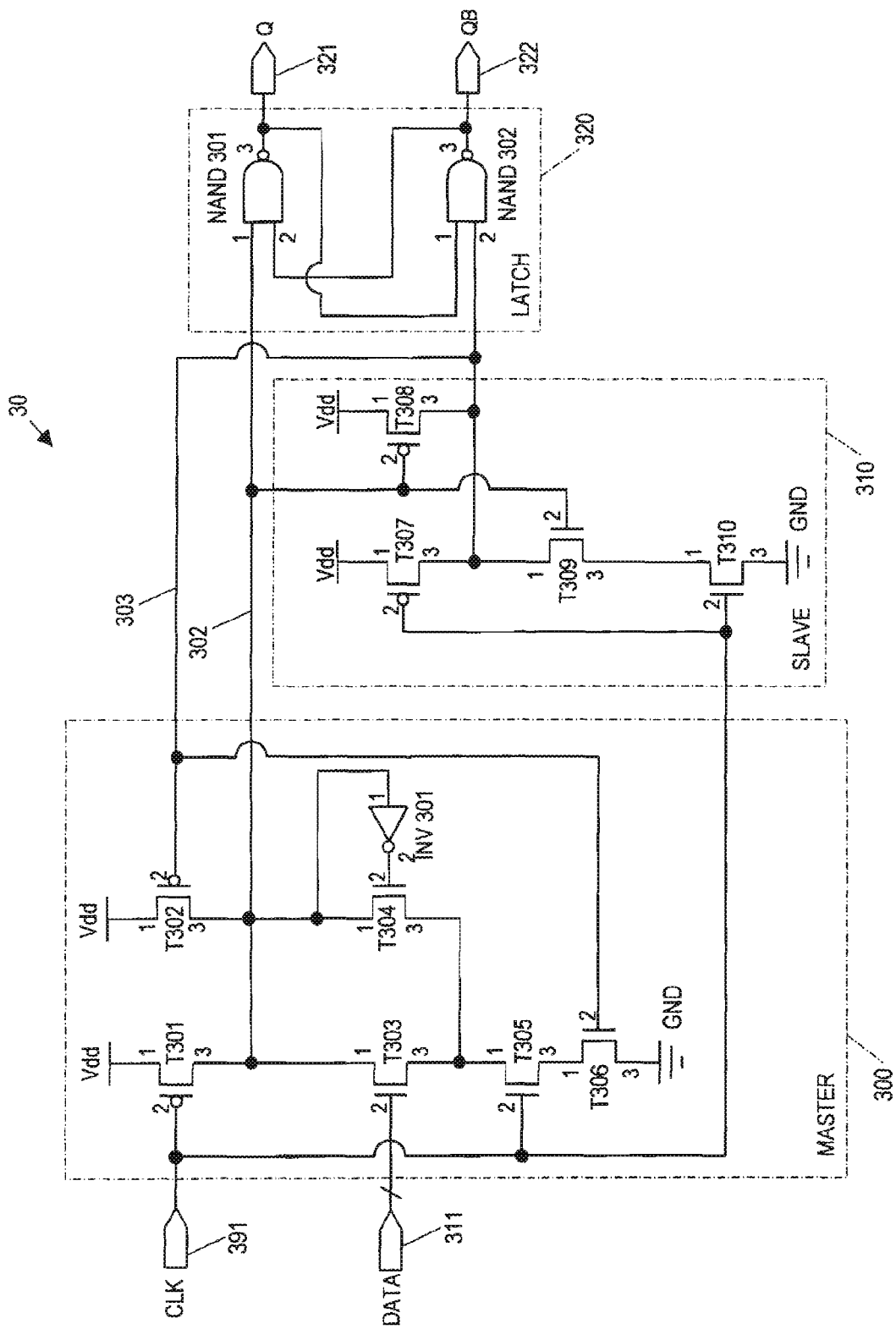
FIG. 3 shows a first exemplary flip-flop circuit.

FIG. 3 shows an exemplary transistor schematic of ASAFF 30 that may include P-channel (PMOS) transistors T301, T302, T307, and T308 and N-channel (NMOS) transistors T303-T306 and T309-T310. In the following discussion, transistor terminals 1 and 3 are either a source or a drain, and terminals 2 are gates. Terminals 1 of transistors T301, T302, T307, and T308 are connected to a first supply terminal and terminals 3 of transistors T306 and T310 are connected to a second supply terminal. In the FIG. 3 example, the first supply terminal is connected to supply voltage $V_{dd}$ and the second supply terminal is connected to ground (GND).

ASAFF 30 includes nodes 302 and 303 that correspond to nodes 102 and 103 of FIGS. 1 and 2, respectively. Node 302 couples together terminals 3, 3, 1, and 1 of transistors T301, T302, T303, and T304, respectively; input terminal 1 of inverter INV 301; terminals 2 of transistors T308 and T309; and input terminal 1 of NAND 301. Node 303 couples together terminals 3, 3, and 1 of transistors T307, T308, and T309, respectively; terminals 2 of transistors T302 and T306; and input terminal 2 of NAND 302. Clock input 391 is coupled to terminals 2 of transistors T301, T305, T307, and T310. Data input 311 is coupled to terminal 2 of transistor T303. Output 321 is coupled to terminals 3 and 1 of NANDs 301 and 302, respectively, and output 322 is coupled to terminals 3 and 2 of NANDs 302 and 301, respectively. Terminals 3 of transistors T303 and T304 and terminal 1 of transistor T305 are connected together; terminals 3 and 1 of transistors T305 and T306, respectively, are connected together; terminals 3 and 1 of transistors T309 and T310, respectively, are connected together; terminals 2 and 3 of NANDs 301 and 302, respectively, are connected together; and terminals 3 and 1 of NANDs 301 and 302, respectively, are connected together.

The correspondence between devices T301-T310, INV 301, NANDs 301 and 302, and circuits 120 and 210-260 of FIG. 2 is shown in Table 1 below. Thus, devices T301-T306 and INV 301 form master 300, transistors T307-T310 form slave 310 and NANDs 301 and 302 form latch 120.

TABLE 1

| Transistors and Logic Gates of FIG. 3 | Circuits of FIG. 2 |
|---|---|
| T301 | First Pre-Charge Circuit 210 |
| T303 | Input Circuit 220 |
| T305 | Evaluator Circuit 230 |
| T306 | Keeper-Down Control Circuit 240 |
| T304 and INV301 | Keeper-Down Circuit 260 |
| T302 | Keeper-Up Circuit 250 |
| T308, T309, and T310 | Second Node Control Circuit 270 |
| T307 | Second Pre-Charge Circuit 272 |
| NANDs 301-302 | Latch Circuit 120 |

When clock input 391 is a 0, nodes 302 and 303 are pre-charged to a 1 by transistors T301 and T307, respectively. When node 303 is a 1, transistor T306 is turned on. Transistor T306 aims transistor T305 to immediately set node 302 upon a clock input rising edge based on the data at data input 311. Transistor T309 is turned on when node 302 is a 1 and arms transistor T310 to set node 303 to a 0 upon the clock input rising edge if node 302 remains at a \.

At a clock input rising edge and if the data at data input 311 is a 0, transistors T301 and T307 are turned off, and transistors T305 and T310 are turned on. Transistor T310 via transistor T309 forces node 303 to a 0 from the pre-charged 1 value after a delay from the clock transition. When node 303 is a 0, transistor T306 turns off thus ending the data hold-time, and transistor T302 turns on and keeps node 302 at the pre-charged 1 value. Thus, a first hold delay from the clock transition to set node 302 to the first value is less than zero, because node 302 is pre-charged to the first value prior to the clock transition. A second hold delay, when node 303 is forced to a 0 after the clock transition, as described above, is greater than the first hold delay. The data hold-time is determined by a delay that is a sum of delays contributed by transistors T310 and T306 and capacitance values such as associated with node 303.

Additionally, even if the data at data input 311 transitioned to a 0 at the same time as the rising edge of the clock input, node 302 will remain at the pre-charged value of 1 because transistors T301 and T303 transition from on to off substantially at the same time forming a race condition. Simultaneously, transistor T310 transitions from off to on, which discharges node 303 via transistor T309. When node 303 discharges to a 0, keeper-up transistor T302 turns on, which reinforces the pre-charged 1 value of node 302. Even though transistor T310 is part of slave 310 and thus slower than transistors in master 300, keeper-up transistor T302 keeps node 302 at the 1 value against any currents that may act otherwise from the race condition between transistors T301 and T303. Thus, the data setup time for a 0 value at data input 311 is substantially 0.

If data input 311 is a 1 or transitions to a 1 at a clock input rising edge, transistor T303 turns on while transistors T301 and T307 turn off, and transistor T305 and T310 turn on. As noted above, transistors T303 and T305 are faster transistors than transistors T307 and T310. Thus, transistors T303 and T305 and transistor T306 that was turned on by the pre-charged 1 value of node 303, pull node 302 to a 0 value after a third hold delay from the clock transition, but before transistor T310 has a chance to discharge node 303 to a 0 value that would turn off transistor T306 and turn on transistor T302. When node 302 is at a 0 value, keeper-down circuit 260 (INV 301 and transistor T304) activates after a second delay from the clock transition to maintain node 302 at 0 value, and transistor T309 is turned off after a fourth hold delay from the clock transition disconnecting transistor T310 from node 303 to prevent discharging node 303 to a 0 from a 1. Hence, node 303 remains at the 1 value and maintains keeper-up transistor T302 in the off condition and transistor T306 in the on condition supporting the operation of INV 301 and transistor T304 to perform the keeper-down function. Thus, when the data input 311 is a 1 or transitions to a 1 at the rising edge of the clock input 391, the third hold delay is less than the fourth hold delay, and the hold-time is between the rising edge of the clock input 391 and the onset of keeper-down circuit 260.

The data set-up time for a 1 value at data input 311 is also substantially 0, because transistor T301 and transistor T303 are connected in series, the data signal can change with the rising edge of clock input 391 without affecting the operations discussed above. For example, if, data input 311 begins to transition from a 0 to a 1 at the rising edge of clock input 391, the rising edge of the data input 311 will begin to turn on transistor T303, and the rising edge of the clock signal will begin to turn on transistor T305 and turn off transistor T301. Because transistor T306 is already turned on, its terminal 1 is a 0 prior to the rising edge of the clock input 391, eliminating any body-effects of transistor T306. Thus, as data input 311 and clock input 391 both rise, series-coupled transistors T303, T305, and T306 form a path to ground and discharge node 302. Thus, substantially 0 setup time is required for a 1 value at data input 311.

Values of nodes 302 and 303 are latched by latch 320. Terminals 1 and 2 of NANDs 301 and 302 of latch 320 are shown as connected directly to nodes 302 and 303 and force outputs 321 and 322 to values consistent with captured input data of data input 311. In particular, if 0 is captured at data input 311, nodes 302 and 303 are set to 1 and 0, respectively, as discussed above. If terminals 3 of NANDs 301 and 302 are initially set to 0 and 1, respectively, then terminals 1 and 2 of NAND 301 would both initially be at 1 resulting in terminal 3 of NAND 301 remaining at 0. Correspondingly, terminals 1 and 2 of NAND 302 are at 0 resulting in terminal 3 remaining at 1. Thus, outputs 321 (Q) and 322 (QB) do not change and remain at 0 and 1, respectively.

If terminals 3 of NANDs 301 and 302 are initially at 1 and 0, respectively, terminal 2 of NAND 302 would be set to 0 by node 303 forcing terminal 3 of NAND 302 to transition to a 1 which results in terminal 2 of NAND 301 to transition to a 1. Terminal 1 of NAND 301 is set to a 1 by node 302. Thus, when terminal 2 of NAND 301 transitions to a 1, terminal 3 of NAND 301 is forced to a 0 which in turn forces terminal 1 of NAND 302 to a 0 and latch 320 reaches a latched condition having outputs 321 and 322 at 0 and 1 values, respectively.

Based on the above discussion, the clock-to-Q delay of ASAFF 30 is the delay of latch 320 plus the time required to set values at nodes 302 and 303. For data input 311 of 0 (d=0), node 302 remains at the pre-charged value and node 303 transitions from a 1 to a 0 being charged by transistor T310. Thus, the clock-to-Q delay for (d=0) is the delay of transistor T310 plus the delay of latch 320. For data input 311 of 1 (d=1), node 302 is charged by transistor T303 and node 303 remains at the pre-charged value. Thus, the clock-to-Q delay for (d=1) is the delay of transistor T303 plus the delay of latch 320.

Table 2 below summarizes transistor and node transitions within ASAFF 30 on a clock rising edge of a 0 to 1 transition extended to the end of the data hold-time.

TABLE 2

| | DATA | CLK | T301 | T302 | T303 | T304 | T305 | T306 | T307 | T308 | T309 | T310 | Node 302 | Node 303 |
|---|---|---|---|---|---|---|---|---|---|---|---|---|---|---|
| PRE-CHARGE | X | 0 | ON | OFF | X | OFF | OFF | ON | ON | OFF | ON | OFF | 1 | 1 |
| EVALUATION | 0 | 1 | OFF | ON | OFF | OFF | ON | OFF | OFF | OFF | ON | ON | 1 | 0 |
| PRE-CHARGE | X | 0 | ON | OFF | X | OFF | OFF | ON | ON | OFF | ON | OFF | 1 | 1 |
| EVALUATION | 1 | 1 | OFF | OFF | ON | ON | ON | ON | OFF | ON | OFF | ON | 0 | 1 |

Figure 4:
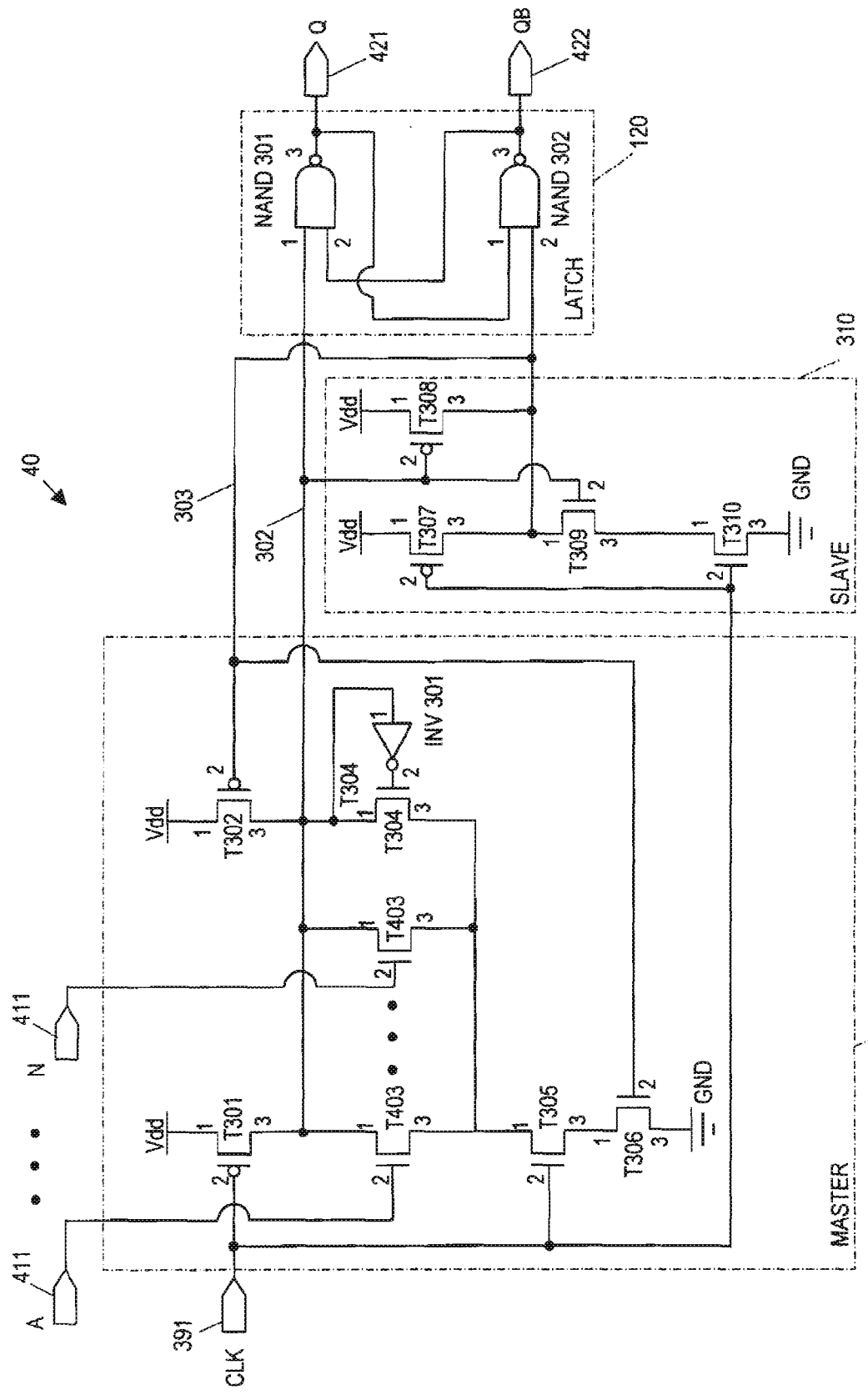
FIG. 4 shows a second exemplary flip-flop circuit that includes OR input logic.

While FIG. 3 shows transistor T303 as the input circuit transferring a value at data input 311 to first node 302, transistor T303 may be replaced with a combinatorial logic to receive multiple data inputs and performing a logical function to generate a value that charges node 302. For example, FIG. 4 shows transistor T303 replaced with transistors T403 that together perform an OR function with input data 411 in master 400. As shown, any number of transistors may be included without impacting the basic timing of ASAFF 40 and all other portions of ASAFF remain the same as shown in FIG. 3. Thus, ASAFF 40 generates outputs 421 and 422 corresponding to outputs 321 and 321 of FIG. 3. Similarly, in FIG. 5, transistor T303 is replaced with transistors T503 for inputs 511 to perform an AND function in master 500. ASAFF 500 generates outputs 521 and 522 corresponding to outputs 321 and 322 of FIG. 3.

The logical function performed by the input circuit can easily be extended to include other more complex combinatorial functions such as NOT, XOR, and so on. However, as the complexity of the combinatorial logic increases, delays caused by the combinatorial logic should be balanced with delays to set nodes 302 and 303.

Figure 5:
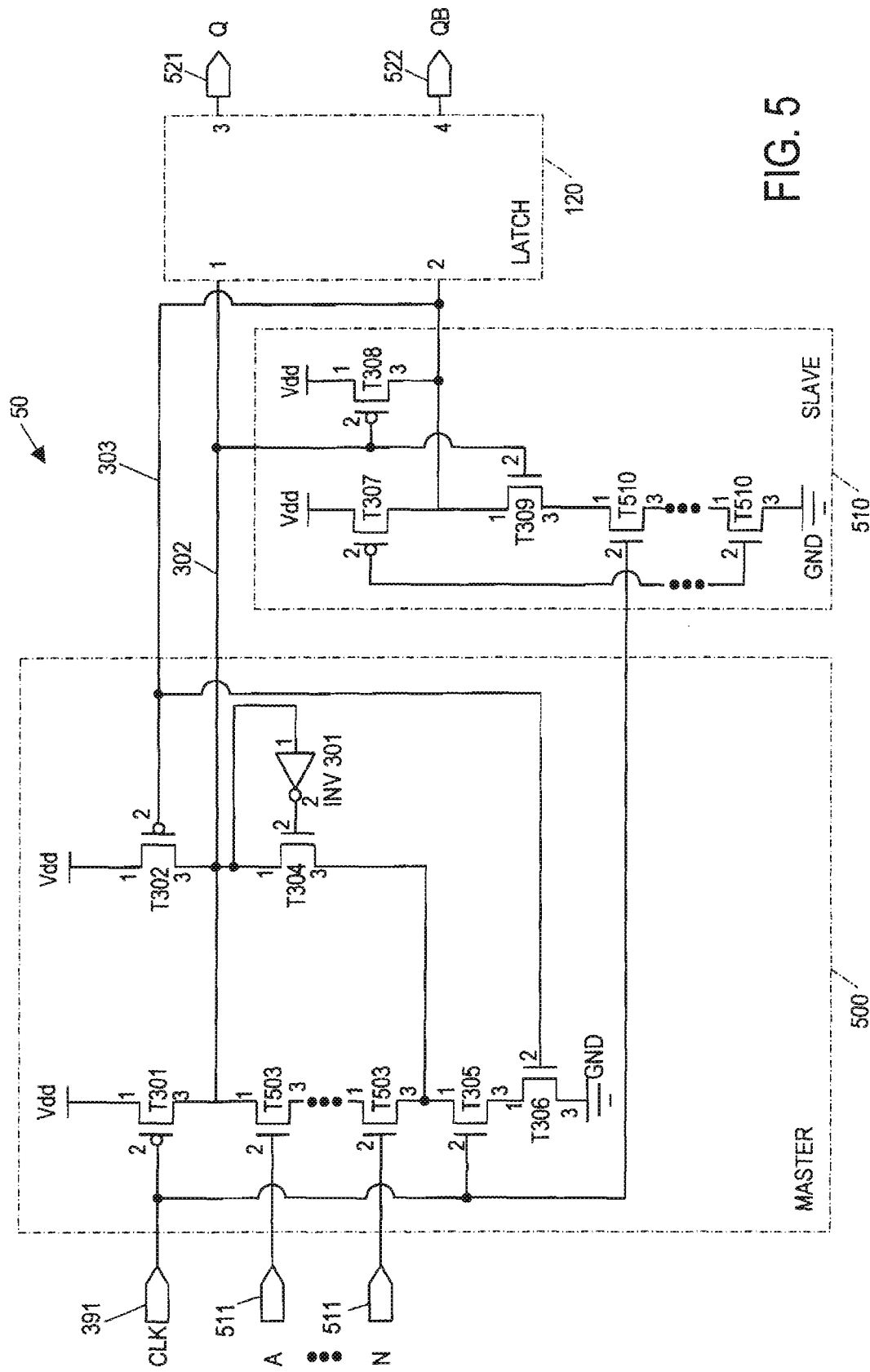
FIG. 5 shows a third exemplary flip-flop circuit that includes AND input logic and additional stacked devices.

For example, in FIG. 5, transistor T310 is replaced with a stack of transistors T510 that substantially matches a number of transistors T503 to balance delays associated with transistors T503 in charging node 302 and delays in slave 510 in charging node 303. As noted above, the delay time through transistors T510 and T309 to set node 303 should be greater than the delay time for transistor T303 to set node 302 if the result of the AND function is a 0 (i.e., all input data are 1s). This delay configuration is important to permit keeper-down control circuit (transistor T306) to set node 302 to a 0 value before transistors T510 can discharge node 303 to a 0 value. When node 302 is a 0, transistor T309 disables transistors T510 from discharging node 303 and thus prevents keeper-up transistor T302 from working against the keeper-down circuit.

Figure 6:
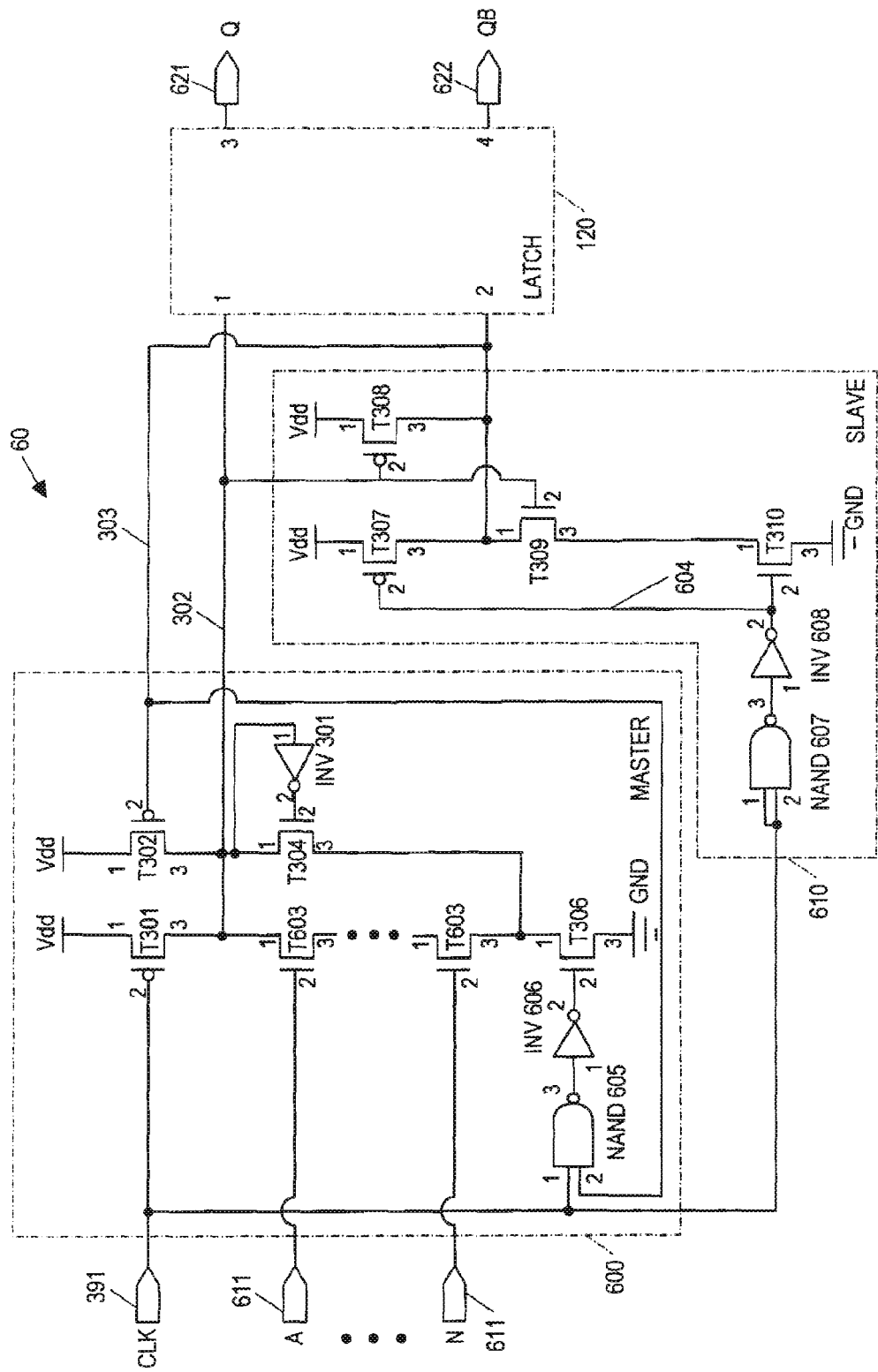
FIG. 6 shows a fourth exemplary flip-flop circuit that includes a first delay balancing circuit.

FIG. 6 shows an alternative delay circuit to be used when transistor T305 of FIG. 3 is replaced with NAND 605 and INV 606 to reduce the size of the stack of transistors. NAND 607 and INV 608 are added to delay the clock transition to terminals 2 of transistors T307 and T310. In FIG. 3, transistor T305 and T306 are in an AND configuration with the clock signal from clock input 391 and the value of node 303 as inputs. NAND 605 and INV 606 form an AND gate that ANDs the clock signal received from clock input 391 and the value of node 303. While FIG. 6 shows delays generated by NAND 607-INV 608 to match the delay introduced by NAND 605-INV 606 and balance delays of transistors T603, an appropriate number of NAND, NOR, INV, transmission gates, or any combination of such devices may be added to achieve the needed delay balancing so that the first and second nodes are charged and discharged in the desired sequence.

Figure 7:
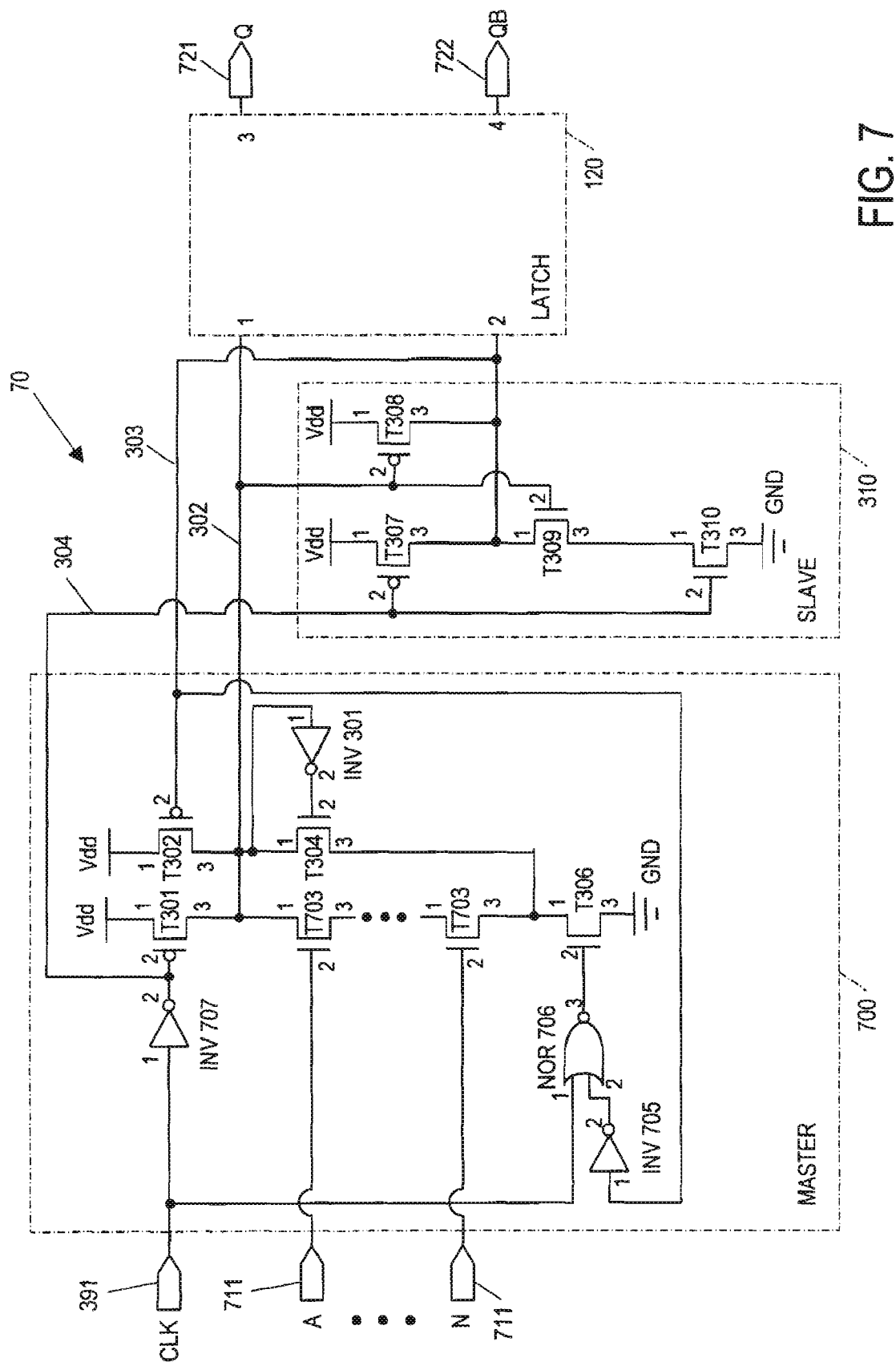
FIG. 7 shows a fifth exemplary flip-flop circuit that includes a second delay balancing circuit.

FIG. 7 shows another alternative delay circuit for capturing input data using a falling edge clock transition that includes delaying the clock transition using INV 707 and replacing transistor T305 of FIG. 3 with INV 705 and NOR 706. Initially, node 303 is pre-charged to a 1. Terminal 1 of NOR 706 is a 1 prior to the clock transition resulting in a 0 terminal 3 of NOR 706 turning transistor T306 off. On the falling edge clock transition from a 1 to a 0, terminal 3 of NOR 706 transitions from a 0 to a 1 and turns transistor T306 on, thus enabling transistors T703 to charge node 302 to a 0 if all inputs are 1s. If such is the case, node 302 becomes a 0, which in turn activates keeper-down circuit (transistor 304 and INV 301) to hold node 302 at a 0.

If any one of the input data is a 0, then on a falling edge of the clock, node 303 will be charged to a 0 by transistors T309 and T310, which in turn activates keeper-up transistor T302. As before, at clock transition from 1 to 0, terminal 3 of NOR 706 transitions from 0 to 1 and turns on transistor T306. However, when node 303 is charged to a 0, terminal 3 of NOR 706 becomes a 0 since both terminals 1 and 2 of NOR 706 are 1s, and transistor T306 is turned off ending the data hold time.

Figure 8:
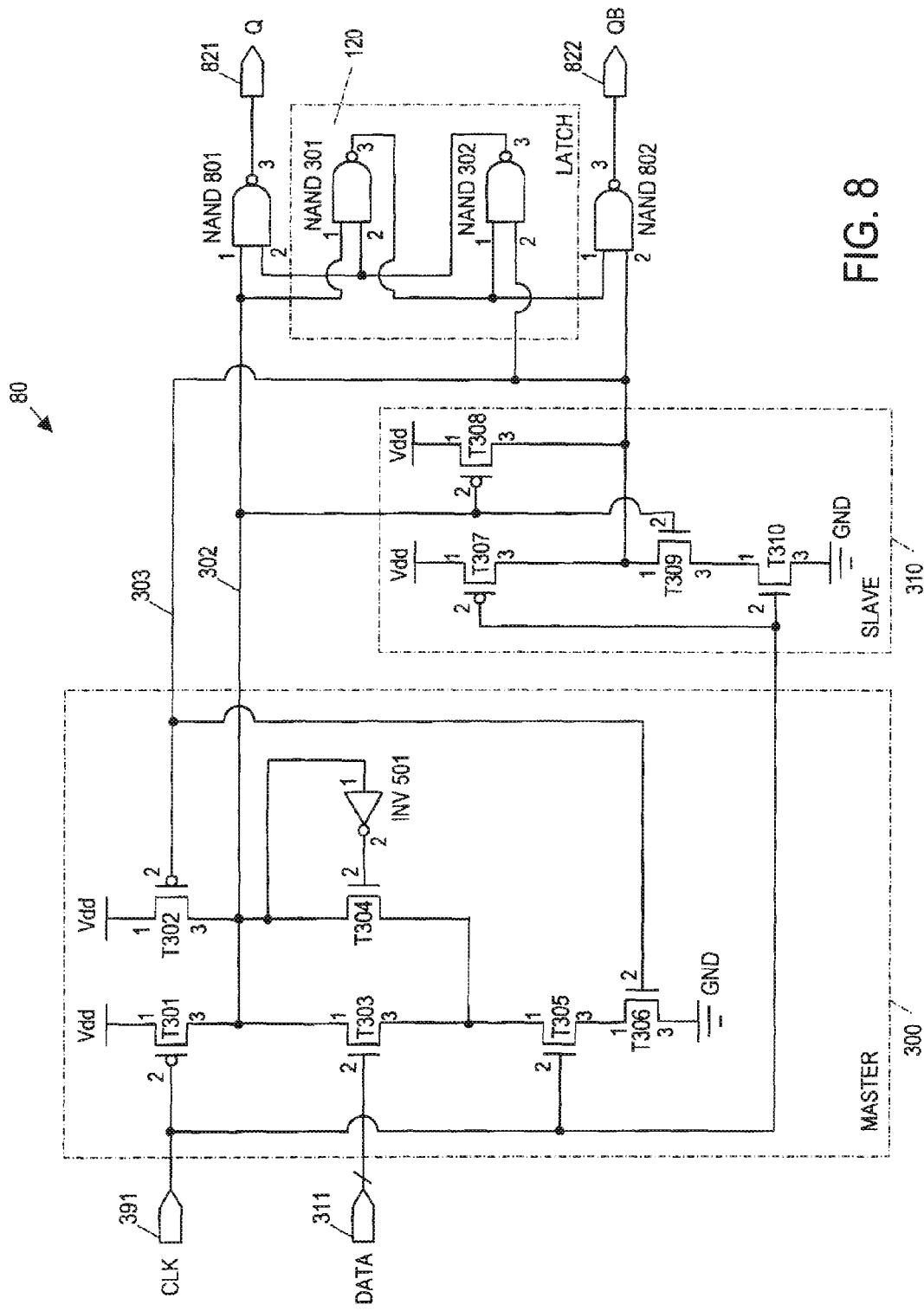
FIG. 8 shows a sixth exemplary flip-flop circuit that includes buffered outputs.

FIG. 8 shows ASAFF 80, which is ASAFF 30 of FIG. 3 enhanced with output buffer NANDs 801 and 802 that isolate latch 120 from noise that may occur at output terminals 3 of latch 120. Input terminals 1 and 2 of NANDs 501 and 502 are connected to input terminals 1 and 2 of NANDs 301 and 302 respectively, thus replicating at the terminals 3 of NANDs 801 and 802 the values of terminals 3 of NANDs 301 and 302, respectively. NANDs 801 and 802 act in parallel with NANDs 301 and 302 so that substantially no additional clock-to-Q delay time is introduced with the exception of additional parasitic capacitance of the additional input terminals 1 and 2 of NANDs 801 and 802. Outputs 821 and 822 have the same logical values as outputs 321 and 322, respectively, of FIG. 3.

Figure 9:
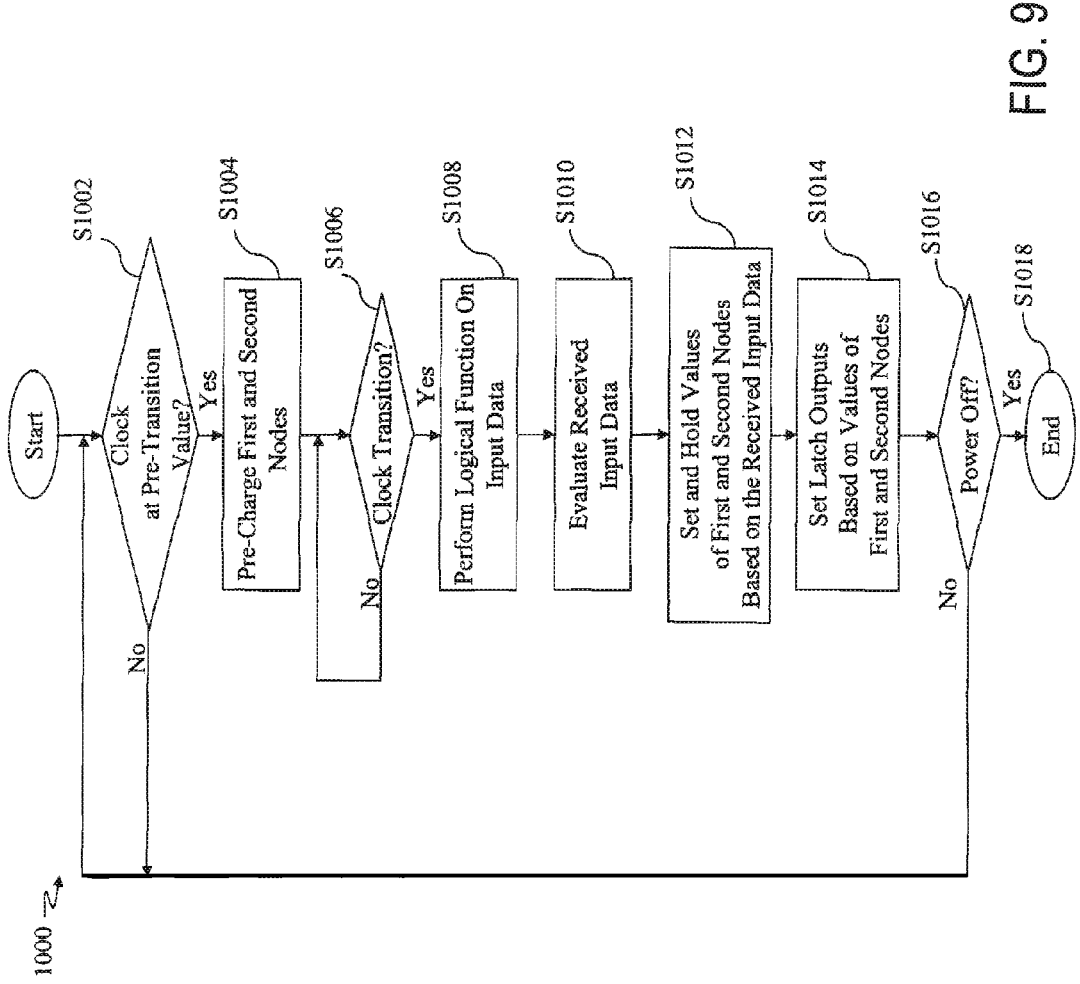
FIG. 9 shows a flow-chart of an exemplary ASAFF process.

FIG. 9 shows a flow chart 1000 of an exemplary ASAFF process. In step S1002, a determination is made as to whether a clock is at a pre-transition value. If the clock is determined to not be at the pre-transition value, then the process goes to step S1004. Otherwise, the process returns to step S1002.

In step S1004, the first and second nodes are pre-charged. For example, in ASAFF 30, nodes 302 and 303 are pre-charged prior to the clock transition. The process then goes to step S1006. In step S1006, a determination is made whether the clock has transitioned. If the clock has not transitioned, then the process returns to step S1006. Otherwise, the process goes to step S1008.

In step S1008, the process performs a logic function based on the input data such as AND, OR, XOR, etc. and goes to step S1010. In step S1010, the received input data is evaluated and the process goes to step S1012. For example, in ASAFF 30, input data is evaluated by charging node 302 to a 0 if input data is a 1 and charging node 303 to a 0 if input data is 0. In step S1012, values of the first and second nodes are set and held based on the received input data and the process goes to step S1014. For example, in ASAFF 30, nodes 302 and 303 are set to a value dependent on input data, and the value of node 302 is held by either transistor T302 or keeper-down circuit 260 (INV 301 and T304).

In step S1014, the latch outputs are set based on values of first and second nodes and the process goes to step S1016. For example, in ASAFF 30, depending on the value of node 302, latch 320 sets output Q to either a 0 or 1. In step S1016, the process determines whether the ASAFF is powered off. If not powered off, the process returns to step S1002. Otherwise, the process goes to step S1018 and ends.

Figure 10:
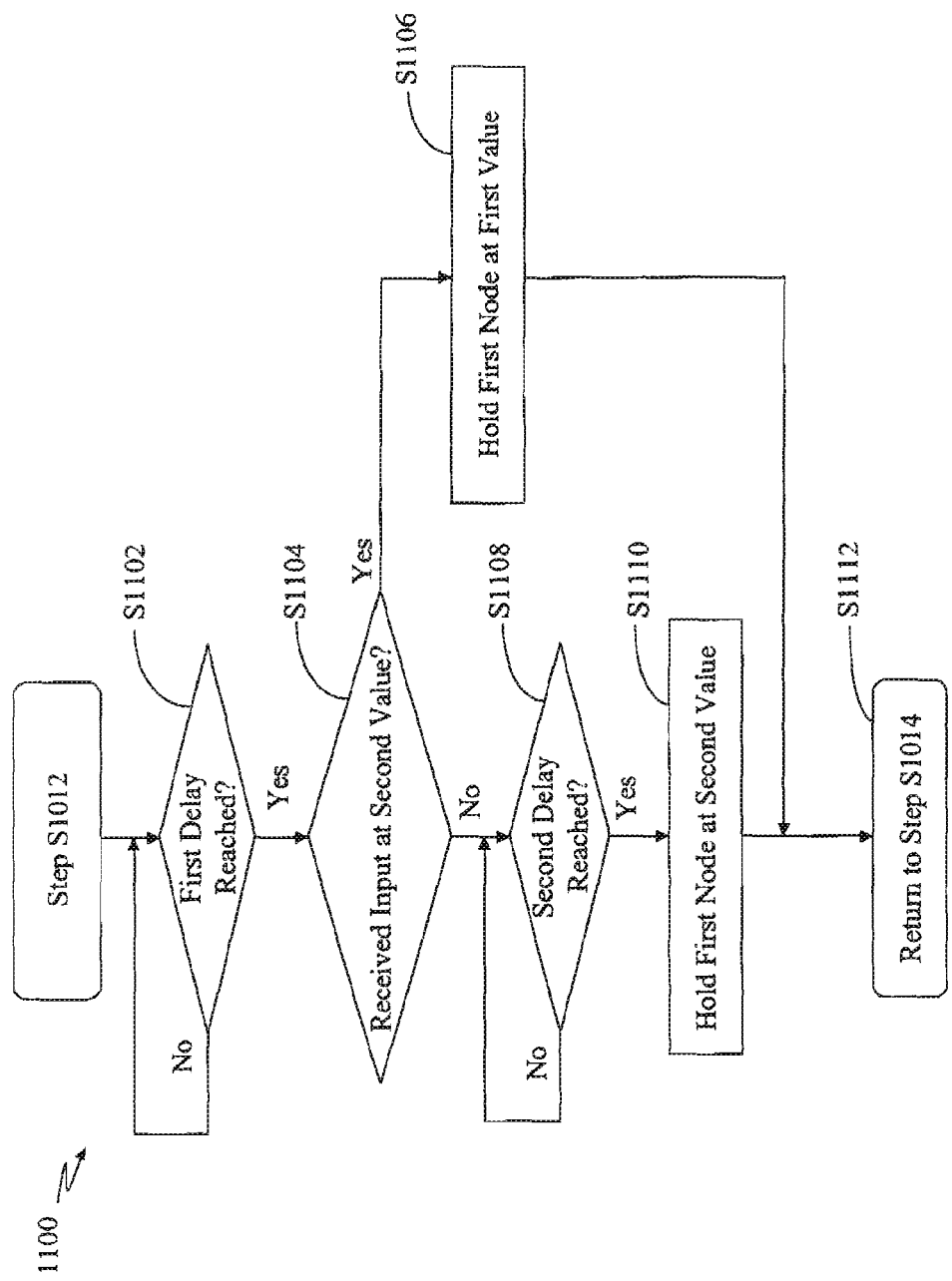
FIG. 10 shows a flow-chart of an exemplary process for setting and holding values of first and second nodes in the ASAFF.

FIG. 10 shows a flow chart 1100 of an exemplary detailed process of step S1012 of flow chart 1000. In step S1102, the process determines whether a first delay is reached. If the first delay is not reached, the process returns to step S1102. Otherwise, the process goes to step S1104. In step S1104, the process determines whether a received input is at a second value. If the received input is at the second value, the process goes to step S1106. Otherwise, the process goes to step S1108. In step S1106, the first node is held at the first value, and the process goes to step S1112 and returns to step S1014 of flow chart 1000. For example, in FIG. 3, when data input is determined to be a 1, after a first delay, keeper-down circuit 260 (T304 and INV301) activates to maintain node 302 at 0.

in step S1108, the process determines whether a second delay is reached. If the second delay is not reached, the process returns to step S1108. Otherwise, the process goes to step S1110. In step S1110, the first node is held at a second value, and the process goes to step S1112 and returns to step S1014 of flow chart 1000. For example, in FIG. 3, when data input is determined to be a 0, after a second delay that can be greater than the first delay to activate keeper-down circuit 260, keeper-up circuit 250 (T302) activates to maintain node 302 at 1.

Figure 11:
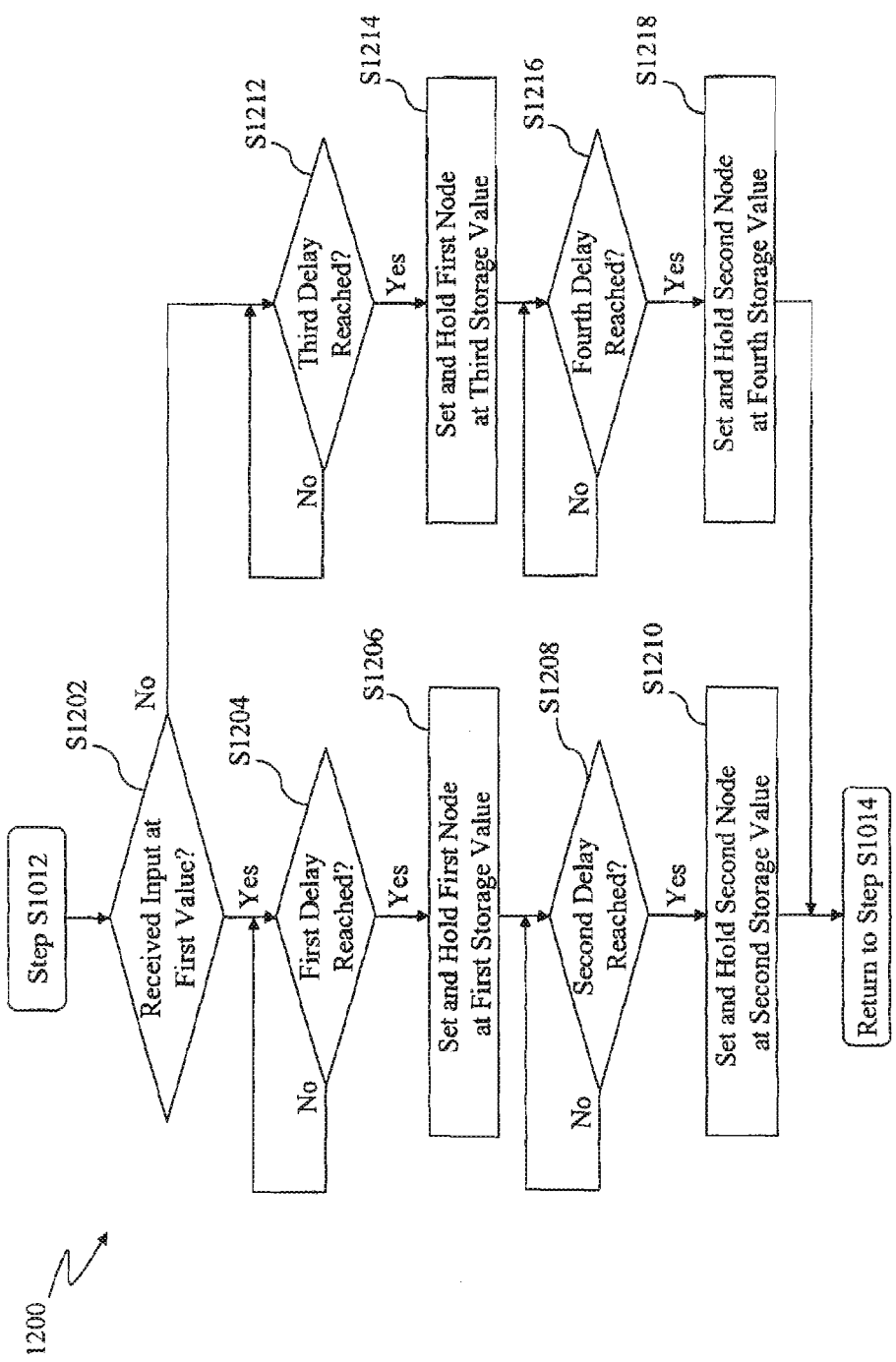
FIG. 11 shows a flow-chart of an another exemplary process for setting and holding values of first and second nodes in the ASAFF.

FIG. 11 shows a flow chart 1200 of an alternative exemplary detailed process of step S1012 of flow chart 1000. In step S1202, the process determines whether a received input is at a first value. If the received input is at the first value, the process goes to step S1204. Otherwise, the process goes to step S1212. In step S1204, the process determines whether a first delay is reached. If the first delay is reached, the process goes to step S1206. Otherwise, the process returns to step S1204. In step S1206, a first node is set and held at a first storage value, and the process goes to step S1208. For example, in FIG. 3, node 302 is set and held at 1 after a first hold delay. In step S1208, the process determines whether a second delay is reached. If the second delay is reached, the process goes to step S1210. Otherwise, the process returns to step S1208. In step S1210, a second node is set and held at a second storage value, and the process returns to step S1014 of flow chart 1000. For example, in FIG. 3, node 303 is forced to a 0 after a second hold delay.

In step S1212, the process determines whether a third delay is reached. If the third delay is reached, the process goes to step S1214. Otherwise, the process returns to step S1212. In step S1214, first node is set and held at a third storage value, and the process goes to step S1216. For example, in FIG. 3, node 302 is pulled to a 0 after a third hold delay. In step S1216, the process determines whether a fourth delay is reached. If the fourth delay is reached, the process goes to step S1218. Otherwise, the process returns to step S1216. In step S1218, second node is set and held at a fourth storage value, and the process returns to step S1014 of flow chart 1000. For example, in FIG. 3, node 303 is held at a 1 after a fourth hold delay.

For purposes of explanation, in the above description, numerous specific details are set forth in order to provide a thorough understanding of the ASAFF. It will be apparent, however, to one skilled in the art that the ASAFF can be practiced without these specific details. In other instances, well-known structures and devices are shown in block diagram form in order to avoid obscuring the ASAFF.

While the ASAFF has been described in conjunction with the specific embodiments thereof, it is evident that many alternatives, modifications, and variations will be apparent to those skilled in the art. Accordingly, embodiments of the ASAFF as set forth herein are intended to be illustrative, not limiting. There are changes that may be made without departing from the spirit and scope of the invention.

What is claimed is:

1. A flip-flop that captures input data based on a clock transition, comprising:
    a master circuit and a slave circuit, the master circuit asymmetrically configured to be faster than the slave circuit, the master circuit directly capturing the input data and the clock transition;
    a first node located between the master circuit and the slave circuit, the clock transition triggering setting the first node to a value based on a received input data;
    a first delay and a second delay that is greater than the first delay; and
    a holding circuit that holds the first node at the value after the second delay from the clock transition when the value is a first value, and holds the first node at the value after the first delay from the clock transition when the value is a second value.

2. The flip-flop of claim 1, further comprising:
    a second node, the second node being set to a third value or a fourth value based on the received input data, wherein the holding circuit comprises:
    a keeper-up circuit that keeps the first node at the second value when the second node is set to the third value; and
    a keeper-down circuit that keeps the first node at the first value when the second node is set to the fourth value.

3. The flip-flop of claim 2, wherein:
    the keeper-up circuit comprises a first transistor that has a control terminal connected to the second node, the first transistor being connected between the first node and a first supply terminal, and
    the keeper-down circuit comprises an inverter having an input terminal connected to the first node and an output terminal connected to a control terminal of a second transistor, the second transistor being connected between the first node and a third node formed by terminals of an input circuit that generated the received input data, and one of an evaluator circuit and a keeper-down control circuit.

4. The flip-flop of claim 2, further comprising:
    a second node control circuit that sets a value of the second node based on the value of the first node.

5. The flip-flop of claim 4, wherein the second node control circuit comprises:
    a first transistor that sets the second node to the fourth value when the first node is at the first value;
    a second transistor that sets the second node to the third value when the first node is at the second value; and
    a third transistor that connects between a terminal of the second transistor and a first supply terminal.

6. The flip-flop of claim 4, further comprising:
    an input circuit that receives the input data;
    a keeper-down control circuit; and
    an evaluator circuit, wherein the evaluator circuit, the input circuit and the keeper-down control circuit cooperate to set the value of the first node when triggered by the clock transition.

7. The flip-flop of claim 6, wherein the input circuit includes one or more transistors that perform a logical function based on the input data to generate the received input data, the input circuit connected between the first node and a third node.

8. The flip-flop of claim 7, wherein the logical function includes one or more of a single one, a combination, or combinations of AND, OR, NOT, Multiplex, and XOR.

9. The flip-flop of claim 6, further comprising one or more delay balancing circuits that balance a delay generated by the input circuit.

10. The flip-flop of claim 9, wherein at least one of the delay balancing circuits comprises:
one or more first delay circuits that delay the clock transition to the keeper-down control circuit; and
one or more second delay circuits that delay the clock transition to the second node control circuit.

11. The flip-flop of claim 6, further comprising a combination circuit that replaces the evaluator circuit and the keeper-down control circuit, wherein the combination circuit incorporates a delay that balances a delay generated by the input circuit.

12. The flip-flop of claim 6, further comprising a third node formed by one or more terminals of the input circuit, a terminal of the keeper-down circuit and a terminal of the evaluator circuit, wherein:
the input circuit is connected between the first node and the third node,
the keeper-down control circuit and the evaluator circuit comprise a first transistor and a second transistor, respectively, that are connected in series between the third node and a first supply terminal, and
a control terminal of the first transistor is connected to a clock input terminal and a control terminal of the second transistor is connected to the second node.

13. The flip-flop of claim 2, further comprising:
a first pre-charge circuit that pre-charges the first node to the second value; and
a second pre-charge circuit that pre-charges the second node to the fourth value, wherein the first and second pre-charge circuits pre-charge the first and second nodes prior to the clock transition.

14. The flip-flop of claim 13, further comprising a clock input terminal, wherein the first pre-charge circuit comprises a first transistor that has a control terminal connected to the clock input terminal and that charges the first node to the second value, and a second pre-charge circuit comprises a second transistor that has a control terminal connected to the clock input terminal and that charges the second node to the fourth value.

15. The flip-flop of claim 2, further comprising a latch that sets one or more outputs of the flip-flop based on values of the first and second nodes at a hold-time after the clock transition.

16. The flip-flop of claim 15, wherein the latch includes a first NAND gate and a second NAND gate, an output of the first NAND gate is connected to a first input terminal of the second NAND gate and an output of the second NAND gate is connected to a first input terminal of the first NAND gate, and a second input terminal of the first NAND gate is connected to the first node and a second input terminal of the second NAND gate is connected to the second node.

17. The flip-flop of claim 16, wherein the one or more outputs of the flip-flop are one or more outputs of the first and second NAND gates.

18. The flip-flop of claim 16, further comprising a third NAND gate and a fourth NAND gate, wherein first and second input terminals of the third NAND gate are connected to the first and second input terminals of the first NAND gate, respectively, first and second input terminals of the fourth NAND gate are connected to the first and second input terminals of the second NAND gate, respectively, and the outputs of the flip-flop are one or more outputs of the third and fourth NAND gates.

19. A flip-flop that captures input data based on a clock transition, comprising:
an input circuit that receives the input data and generates received input data based on a logical function of the input data;
a first node and a second node, the clock transition triggering setting the first node to a first value or a second value, and the second node to a third value or a fourth value, the first through fourth values being set based on the received input data;
a keeper-down circuit that holds the first node to the first value after a first delay from the clock transition;
a keeper-up circuit that holds the first node to the second value after a second delay from the clock transition after the second node is set to the third value, the second delay being greater than the first delay; and
a latch that generates outputs of the flip-flop based on values of the first and second nodes determined at a hold-time after the clock transition.

20. A method for operating a flip-flop, comprising:
configuring asymmetrically a master circuit to be faster than a slave circuit;
feeding an input data and a clock transition directly to the master circuit;
setting a first node being located between the master circuit and the slave circuit to a value based on a received input data;
holding the first node at the value after a first delay from a clock transition when the value is a first value; and
holding the first node at the value after a second delay from a clock transition when the value is a second value that is different from the first value, the second delay being greater than the first delay.

21. The method of claim 20, further comprising:
pre-charging the first node to the second value before the clock transition;
pre-charging a second node to a third value before the clock transition;
setting the second node to a fourth value after the second delay when the first node is set to the second value, the fourth value being different from the third value; and
executing the first holding step only when the second node is set to the fourth value.

22. The method of claim 21, further comprising:
latching values of the first and second nodes after a hold-time; and
setting one or more outputs of the flip-flop based on the latched values.

23. The method of claim 22, further comprising:
generating the outputs of the flip-flop by one of:
outputting outputs of a latch as the outputs of the flip-flop, and
outputting the outputs of the latch through an output buffer.

24. The method of claim 21, further comprising:
performing a logical function based on input data after the clock transition; and
generating the received input data based on a result of the logical function.

25. The method of claim 24, further comprising:
balancing delays generated by the performing step by delaying the setting the second node step and delaying an end of an input data hold-time.

26. A flip-flop comprising:
master means for setting and holding a value of a first node based on a received input data, holding the first node at the value after a first delay from a clock transition when the value is a first value, holding the first node at the value after a second delay from a clock transition when the value is a second value, and the second delay being greater than the first delay;
slave means for setting a value of a second node; and
output means for outputting one or more values of the flip-flop based on values of the first and second nodes, wherein
the master means is asymmetrically configured to be faster than the slave means, the master means for directly capturing the received input data and the clock transition, and the first node being located between the master means and the slave means.

27. The flip-flop of claim 26, wherein the master means comprises:
keeper-down means for holding the first node at a first value; and
keeper-up means for holding the first node at a second value.

28. The flip-flop of claim 26, further comprising:
first pre-charging means for pre-charging the first node; and
second pre-charging means for pre-charging the second node.

29. The flip-flop of claim 26 further comprising:
received input generating means for generating a received input by performing a logic function on input data.

30. The flip-flop of claim 29, further comprising:
delay balancing means for balancing a delay generated by the received input generating means and one or more delays of a clock transition to the master means and the slave means.

31. A flip-flop comprising:
a master circuit that sets and holds a value of a first node based on a received input data, holds the first node at the value after a first delay from a clock transition when the value is a first value, holds the first node at the value after a second delay from a clock transition when the value is a second value, and the second delay being greater than the first delay;
a slave circuit that sets a value of a second node; and
an output circuit that outputs one or more values of the flip-flop based on values of the first and second nodes, wherein
the master circuit is asymmetrically configured to be faster than the slave circuit, the master circuit directly capturing the received input data and the clock transition, and the first node being located between the master circuit and the slave circuit.

32. The flip-flop of claim 31, wherein the master circuit comprises:
a keeper-down circuit that holds the first node at a first value; and
a keeper-up circuit that holds the first node at a second value.

33. The flip-flop of claim 31, further comprising:
a first pre-charging circuit that pre-charges the first node; and
a second pre-charging circuit that pre-charges the second node.

34. The flip-flop of claim 31 further comprising:
a received input generating circuit that generates a received input by performing a logic function on input data.

35. The flip-flop of claim 34, further comprising:
a delay balancing circuit that balances a delay generated by the received input generating circuit and one or more delays of a clock transition to the master circuit and the slave circuit.

36. A flip-flop that captures input data based on a clock transition, comprising:
a master circuit and a slave circuit, the master circuit asymmetrically configured to be faster than the slave circuit, the master circuit directly capturing the input data and the clock transition;
a first node and a second node, the first node being located between the master circuit and the slave circuit, the clock transition triggering setting the first node and the second node to a value based on a received input data;
a first hold delay and a second hold delay that is less than the first hold delay; and
a third hold delay and a fourth hold delay that is less than the third hold delay, wherein the flip-flop holds the first node at a first storage value after the first hold delay and the second node at a second storage value after the second hold delay from the clock transition when the received input data is a first value, and holds the first node at a third storage value after the third hold delay and the second node at a fourth storage value after the fourth hold delay from the clock transition when the received input data is a second value.

37. The flip-flop of claim 36, further comprising:
a keeper-up circuit that keeps the first node at the first storage value when the second node is set to the second storage value; and
a keeper-down circuit that keeps the first node at the third storage value when the second node is set to the fourth storage value.

38. The flip-flop of claim 37, wherein:
the keeper-up circuit comprises a first transistor that has a control terminal connected to the second node, the first transistor being connected between the first node and a first supply terminal, and
the keeper-down circuit comprises an inverter having an input terminal connected to the first node and an output terminal connected to a control terminal of a second transistor, the second transistor being connected between the first node and a third node formed by terminals of an input circuit that generated the received input data, and one of an evaluator circuit and a keeper-down control circuit.

39. The flip-flop of claim 37, further comprising:
a second node control circuit that sets a value of the second node based on the value of the first node.

40. The flip-flop of claim 39, wherein the second node control circuit comprises:
a first transistor that sets the second node to the fourth storage value when the first node is at the third storage value;
a second transistor that sets the second node to the second storage value when the first node is at the first storage value; and
a third transistor that connects between a terminal of the second transistor and a first supply terminal.

41. The flip-flop of claim 39, further comprising:
an input circuit that receives the input data;
a keeper-down control circuit; and
an evaluator circuit, wherein the evaluator circuit, the input circuit and the keeper-down control circuit cooperate to set the value of the first node when triggered by the clock transition.

42. The flip-flop of claim 41, wherein the input circuit includes one or more transistors that perform a logical function based on the input data to generate the received input data, the input circuit connected between the first node and a third node.

43. The flip-flop of claim 42, wherein the logical function includes one or more of a single one, a combination, or combinations of AND, OR, NOT, Multiplex, and XOR.

44. The flip-flop of claim 41, further comprising one or more delay balancing circuits that balance a delay generated by the input circuit.

45. The flip-flop of claim 44, wherein at least one of the delay balancing circuits comprises:
one or more first delay circuits that delay the clock transition to the keeper-down control circuit; and
one or more second delay circuits that delay the clock transition to the second node control circuit.

46. The flip-flop of claim 41, further comprising a combination circuit that replaces the evaluator circuit and the keeper-down control circuit, wherein the combination circuit incorporates a delay that balances a delay generated by the input circuit.

47. The flip-flop of claim 41, further comprising a third node formed by one or more terminals of the input circuit, a terminal of the keeper-down circuit and a terminal of the evaluator circuit, wherein:
the input circuit is connected between the first node and the third node,
the keeper-down control circuit and the evaluator circuit comprise a first transistor and a second transistor, respectively, that are connected in series between the third node and a first supply terminal, and
a control terminal of the first transistor is connected to a clock input terminal and a control terminal of the second transistor is connected to the second node.

48. The flip-flop of claim 37, further comprising:
a first pre-charge circuit that pre-charges the first node to the first storage value; and
a second pre-charge circuit that pre-charges the second node to the fourth storage value, wherein the first and second pre-charge circuits pre-charge the first and second nodes prior to the clock transition.

49. The flip-flop of claim 48, further comprising a clock input terminal, wherein the first pre-charge circuit comprises a first transistor that has a control terminal connected to the clock input terminal and that charges the first node to the first storage value, and a second pre-charge circuit comprises a second transistor that has a control terminal connected to the clock input terminal and that charges the second node to the fourth storage value.

50. The flip-flop of claim 37, further comprising a latch that sets one or more outputs of the flip-flop based on values of the first and second nodes at a hold-time after the clock transition.

51. The flip-flop of claim 50, wherein the latch includes a first NAND gate and a second NAND gate, an output of the first NAND gate is connected to a first input terminal of the second NAND gate and an output of the second NAND gate is connected to a first input terminal of the first NAND gate, and a second input terminal of the first NAND gate is connected to the first node and a second input terminal of the second NAND gate is connected to the second node.

52. The flip-flop of claim 51, wherein the one or more outputs of the flip-flop are one or more outputs of the first and second NAND gates.

53. The flip-flop of claim 51, further comprising a third NAND gate and a fourth NAND gate, wherein first and second input terminals of the third NAND gate are connected to the first and second input terminals of the first NAND gate, respectively, first and second input terminals of the fourth NAND gate are connected to the first and second input terminals of the second NAND gate, respectively, and the outputs of the flip-flop are one or more outputs of the third and fourth NAND gates.

\* \* \* \* \*